(12) United States Patent
Park et al.

(10) Patent No.: US 6,583,631 B2
(45) Date of Patent: Jun. 24, 2003

(54) PRECISE DIELECTRIC CONSTANT SENSOR

(75) Inventors: Kyong M. Park, Westlake Village, CA (US); Nhan Nguyen, Simi Valley, CA (US)

(73) Assignee: Kavlico Corporation, Moorpark, CA (US)

( * ) Notice: Subject to any disclaimer, the term of this patent is extended or adjusted under 35 U.S.C. 154(b) by 113 days.

(21) Appl. No.: 09/759,865

(22) Filed: Jan. 12, 2001

(65) Prior Publication Data

US 2002/0093344 A1 Jul. 18, 2002

(51) Int. Cl.[7] ............................................... G01R 27/26
(52) U.S. Cl. ........................................ 324/663; 324/667
(58) Field of Search ................................. 324/663, 667; 340/631; 73/304 C; 156/273.1; 438/600; 205/101

(56) References Cited

U.S. PATENT DOCUMENTS

| | | | | |
|---|---|---|---|---|
| 4,384,899 A | * | 5/1983 | Myers | 156/273.1 |
| 4,470,300 A | | 9/1984 | Kobayashi | 73/304 C |
| 4,987,776 A | * | 1/1991 | Koon | 73/304 C |
| 5,051,921 A | * | 9/1991 | Paglione | 73/304 C |
| 5,088,325 A | * | 2/1992 | Eichberger | 73/304 C |
| 5,540,086 A | | 7/1996 | Park et al. | 73/53.05 |
| 5,604,441 A | * | 2/1997 | Freese | 324/667 |
| 5,754,055 A | * | 5/1998 | Mc Adoo | 324/636 |
| 5,824,889 A | | 10/1998 | Park et al. | 73/116 |
| 5,840,170 A | * | 11/1998 | Nagy | 205/101 |
| 5,900,810 A | | 5/1999 | Park et al. | 340/450.3 |
| 5,907,278 A | | 5/1999 | Park et al. | 340/450.3 |
| 5,929,754 A | | 7/1999 | Park et al. | 340/439 |
| 6,245,663 B1 | * | 6/2001 | Zhao et al. | 438/600 |

* cited by examiner

Primary Examiner—Christine K. Oda
(74) Attorney, Agent, or Firm—Oppenheimer Wolff & Donnelly LLP

(57) ABSTRACT

An assembly for sensing the dielectric constant of liquids, and for detecting contamination, includes a central ceramic chip with a sensing capacitor formed on one end thereof and a signal processing circuit on the other end thereof. The capacitor is formed of two sets of closely spaced conductive lines or pathways with one set being grounded and the other set providing the variable output from the capacitor to the signal processing circuit.

10 Claims, 2 Drawing Sheets

PRECISE DIELECTRIC CONSTANT SENSOR

BACKGROUND OF THE INVENTION

1. Field of the Invention

This invention relates to capacitive sensors for measuring the dielectric constant of fluids and for detecting contaminants.

2. General Background and State of the Art

Various geometries have been proposed heretofore for capacitive sensors for liquids, see, for example, U.S. Pat. Nos. 4,470,300, 5,540,086, 5,824,889, 5,900,810, 5,907,278 and 5,929,754. When used to determine the dielectric constant of oil in internal combustion engines, these known sensors with widely spaced capacitive plates, measure the average dielectric constant of the fluids; and accordingly very fine bubbles or finely dispersed droplets of water in the oil indicate a change in the dielectric constant of the oil, rather than identifying the possibly serious problem represented by the presence of water in the engine motor oil.

In addition, the prior art sensors have generally included entirely separate sensing capacitor structures and electronic circuits, with resultant relatively costly construction.

INVENTION SUMMARY

Accordingly, principal objects of the invention include simplifying capacitive sensing assemblies; and providing a sensor which will readily detect contamination such as fine droplets or bubbles of water in oil.

In accordance with one illustrative embodiment of the invention, a capacitive sensing system includes a small printed circuit board with a sensing capacitor formed at one end of the printed circuit board, with the capacitor being formed by a pair of sets of closely spaced conductive lines or pathways printed on the circuit board. Preferably one set of printed conductive lines are closely spaced from a second set of printed conductive lines, to form the two terminals of the capacitor.

The other end of the printed circuit board may have signal processing circuitry thereon, and the printed conductive lines for the signal processing circuitry may be formed concurrently with the conductive lines forming the sensing capacitor.

The printed circuit board may be mounted in a housing, with mounting arrangements for securing the housing for extending into an enclosure, such as an oil pan, containing the liquid to be sensed. The capacitor end of the printed circuit board is exposed to the liquid, and a seal or seals are provided to isolate the signal processing circuitry from the liquid.

The two sets of conductive lines forming the sensing capacitor are preferably closely spaced from one another, preferably in the order of 0.01 or 0.02 inch apart, within the range of about 0.005 inch to about 0.100 inch apart.

In the case of a sensor for determining oil deterioration in an internal combustion engine, and possible water contamination, it is noted that oil has a dielectric constant of about 1.6 to 3.2, depending on brand and age, while the dielectric constant of water is about 87.5 and that of coolant (ethylene glycol) is about 37.0. With the sensing capacitor configurations as shown in the patents cited above, having fairly wide spacing of the capacitor plates, and with water contamination, when it occurs, having very finely divided water droplets or bubbles in the oil, the bulk or average dielectric constant is measured. With oil deterioration being accompanied by an increase in dielectric constant, and with water and coolant having dielectric constants very much greater than oil, a false indication of early oil deterioration may be indicated. In addition, the dangerous condition of water in the oil, possibly indicative of a leaky head gasket or other serious problem, may go undetected.

However, with a sensor of the present invention, the presence of a droplet of water in close proximity to the lines representing the two sides of the sensing capacitor will cause a sharp change in the sensor output, thereby clearly indicating a possible serious engine problem.

Returning now to the sensor assembly, the sensing capacitor conductors, and the conductors for the signal processing circuitry may be formed concurrently, by silk screening a conductive paste onto a small ceramic circuit board, and firing the unit to permanently form and bond the conductive lines or interconnections in place. A thin insulating coating of glass may then be applied over the conductive lines forming the sensing capacitor.

In accordance with a broad aspect of the invention, a capacitive sensor may be formed of a pair of sets of extended conductive lines formed on a circuit board, with the lines being spaced apart by less than 0.10 inch, preferably less than 0.050 inch; and a housing is provided for mounting on a container for fluid, with the capacitive sensor extending into the container and being exposed to the fluid.

Supplemental aspects of the preferred embodiments involve the application of a thin insulating coating, preferably formed of glass, over the printed capacitor, and the use of a fired conductive paste to form the conductive lines on the circuit board.

Other objects, features and advantages of the invention will become apparent from a consideration of the following detailed description and the accompanying drawings.

DETAILED DESCRIPTION OF THE PREFERRED EMBODIMENTS

Figure 1:
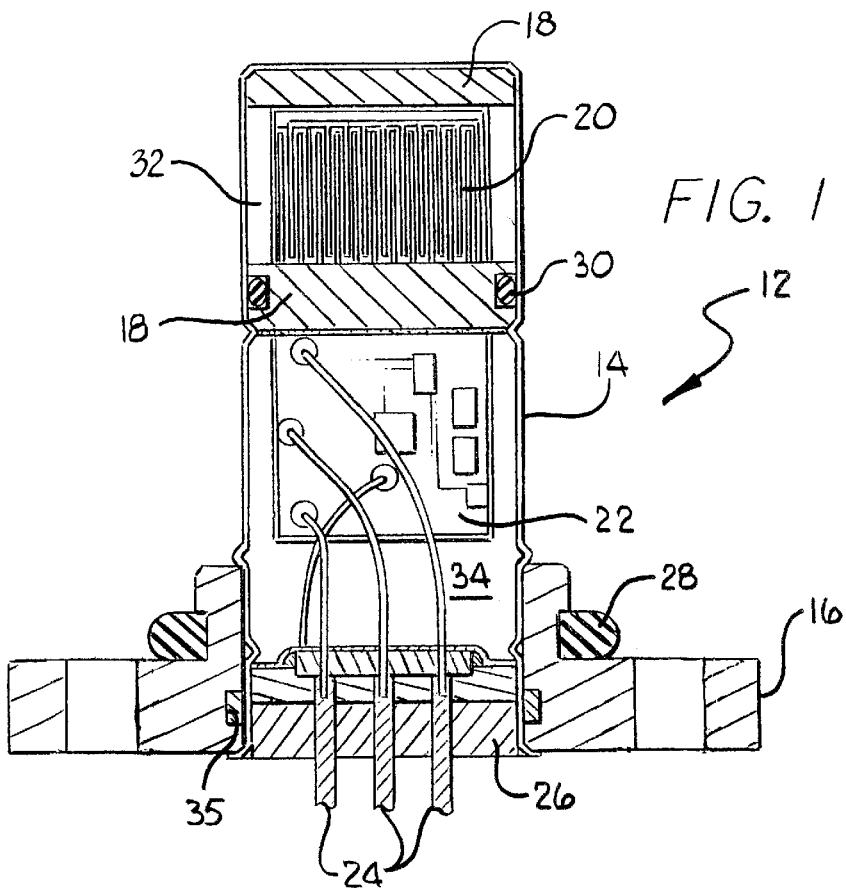
FIG. 1 is a cross-sectional view of a sensor assembly illustrating the principles of the present invention.
Figure 2:
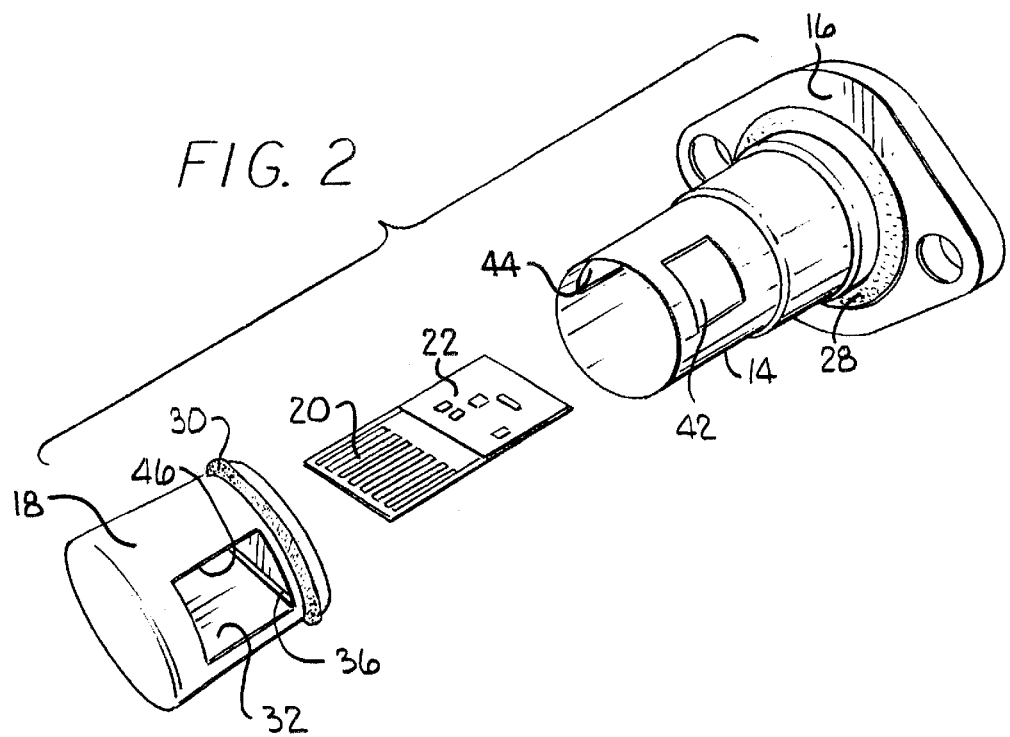
FIG. 2 is an exploded view of the sensor assembly of FIG. 1.

Referring more particularly to the drawings, FIG. 1 is a cross-sectional view of an assembly 12 including a metal housing 14, a plastic mounting base member 16, an inner plastic support 18, and a central ceramic plate or circuit board including a sensing capacitor 20 at one end thereof, and signal processing electronics mounted on the other end 22. Power input and signal output from the assembly of FIG. 1 is accomplished through the connector pins 24 which extend through the insulating output plate 26. A gasket for holding 28 is provided to seal the assembly against the container, such as an internal combustion engine oil pan, which contains the liquid to be sensed. Similarly, the gasket or O-ring 30 seals the plastic member 18 to the metallic housing 14 and prevents the flow of liquids being sensed from the open area 32 to the space 34 where the signal processing electronics are located. An additional seal 35 is provided between base member 16 and housing 14; and the circuit board is also sealed as it extends through the slot 36 as shown in FIG. 2. This sealing may be accomplished using a gasket or a sealing material such as epoxy.

Referring now to the exploded view of FIG. 2, it may be noted that the plastic member 18 has a slot 36 through which the part 20, 22 extends, with the capacitor portion 20 extending into the space 32 which is exposed to the liquids to be tested, and with the signal processing electronics 22 being outside of space 32 in the isolated space 34, as indicated in FIG. 1. It may also be noted that the housing 14 has an opening 42 on one side, and a similar opening 44 on the other side thereof. Similarly, the plastic part 18 has two openings, one of which is designated by the reference numeral 46, which match the openings 42 and 44 through which the liquids to be measured readily flow.

Figure 3:
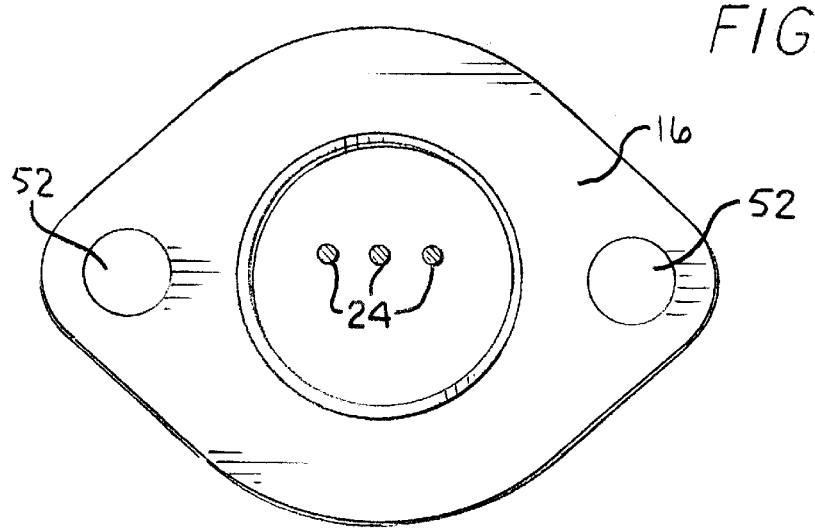
FIG. 3 is an end view of the base of the sensor assembly of FIGS. 1 and 2.

Turning now to FIG. 3 of the drawings, it is a simple end view of the assembly of FIG. 1 showing the mounting plate or base 16 and the connector pins 24, which interconnect the signal processing electronics with the "outside world." Also shown in FIG. 3 are the mounting holes 52 by which the assembly may be secured to the container which holds the liquids to be measured. Suitable screws or bolts extending through holes 52 may be employed to hold the assembly to the fluid containing vessel containing the liquids to be measured. Instead of mounting holes as shown in the present drawings, the housing itself may be provided with external threads extending around the entire periphery thereof in place of the mounting plate 16, so that the entire unit may be threaded into a mating threaded hole in the container in which the fluids are located.

Figure 4:
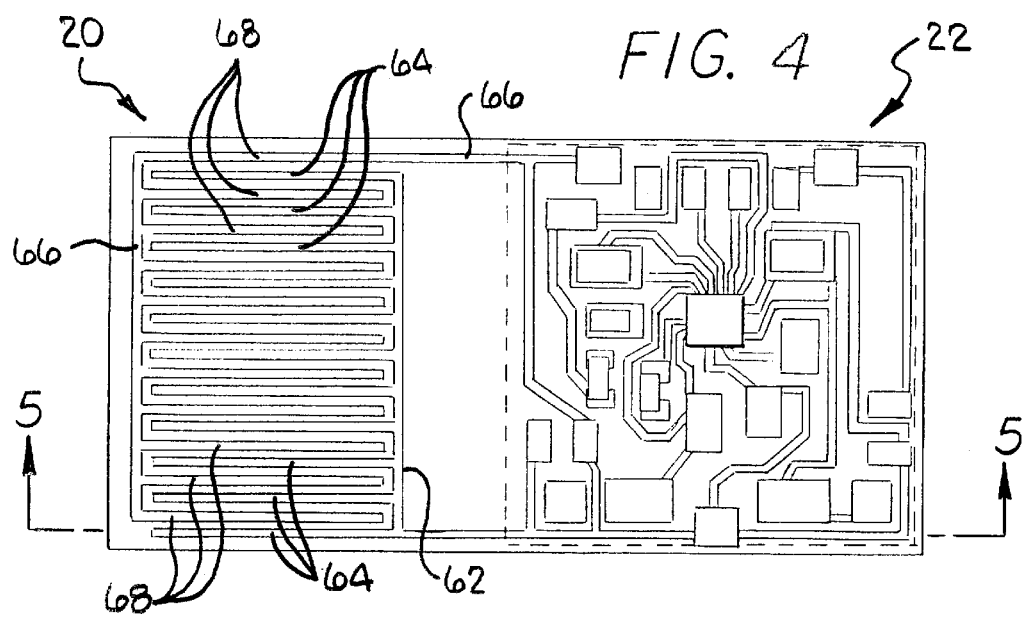
FIG. 4 is an enlarged view of the sensing capacitor and associated signal processing circuitry.
Figure 5:
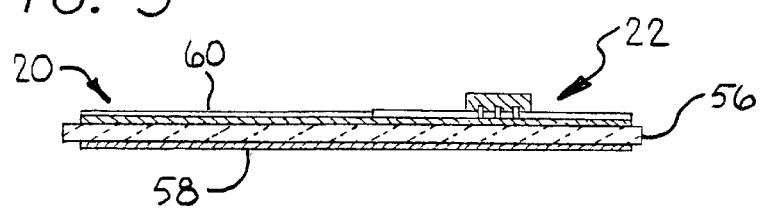
FIG. 5 is a cross-sectional view taken along line 5—5 of FIG. 4.

FIGS. 4 and 5 are enlarged showings of the central part 20, 22 as shown in FIGS. 1 and 2 of the drawings. More specifically, as shown to advantage in FIG. 5 of the drawings, a central ceramic plate 56 is provided with a complete conductive or resistive ground plane layer 58 and conductive lines or pathways 60, forming the sensing capacitor 20 at the left-hand end as shown in FIG. 5, and forming the conductors for the signal processing electronics 22 at the right-hand side of FIG. 5.

Referring now to FIG. 4 of the drawings, the sensing capacitor is formed of two interfitting comb-like arrays of conductive lines or pathways, with one grounded set 62 having a large number of conductive lines or pathways 64 extending to the left as shown in FIG. 4. The other terminal 66 of the sensing capacitor is coupled to the series of conductive lines or pathways 68, which interfit with the grounded conductive lines or pathways 64 of the assembly.

These interfitting conductive lines or pathways 62, 64, 66, 68, are quite closely spaced together. More specifically, they are preferably spaced apart by approximately 10- or 20-thousandths of an inch, with a broader range being a spacing of less than 0.050-inch or 0.10-inch.

As mentioned above, the seals 28 and 30 are intended to prevent leakage from the container, and to prevent leakage from the zone 32 where the liquids circulate through to the volume 34 where the signal processing circuitry is located. In addition, the ceramic substrate extends through a slot 36 in the plastic port member 18, and is sealed as it passes through this slot, either by appropriate gasket or by the use of epoxy, or some similar sealing material to prevent the flow of liquid through the slot from the zone 32 into the volume 34 where the signal processing circuitry is located.

Incidentally, the signal processing circuitry 22 on the ceramic substrate serves to convert the changes in capacitance of the capacitor 20 to a DC voltage output. A number of different types of circuits could be employed, but one such circuit is shown in U.S. Pat. No. 4,398,426, granted Aug. 16, 1983. For the purposes of this type of signal processing circuit, it is useful to have a reference capacitor against which the variable capacitor 20 is compared. This type of reference capacitor may be mounted on the substrate and included in the signal processing circuitry 22.

With regard to dimensions and materials, in one operative embodiment, the ceramic substrate measured approximately 1 and 1/8-inch by 9/16-inch, and was approximately 20-thousands of an inch thick. It is to be understood of course that the foregoing dimensions were merely those of one operative example of the invention, and that the substrate could have somewhat different dimensions as may be called upon for a particular application. The substrate was formed of alumina, or aluminum oxide, and the conductive lines or pathways were formed by silk screening a paste including silver and palladium as principle ingredients of the conductive paste. Following silk screening of the conductive lines onto the substrate, it was fired to form conductive lines bonded to the substrate at a temperature of approximately 850° C. Following the foregoing step, a thin layer of insulating material was applied over the conductive lines or pathways. Preferably, this outer insulating coating was formed of glass, which is initially applied in the form of a glass paste with very finely divided gloss particles or frit therein, and is subsequently fired at approximately 620° C. With different conductive and glass pastes, the firing temperatures would be correspondingly adjusted, depending on the melting or softening points of the materials. Instead of silk screening a pattern of conductive lines onto the substrate, the entire substrate could be coated with a conductive layer, and using conventional printed circuit techniques, portions of the conductive layer could be etched away, to leave the desired pattern. Also, instead of glass, other thin insulating coatings, such as a thin plastic coating, may be used to cover the conductive pathways.

In closing, it is to be understood that the foregoing detailed description and the accompanying drawings relate to one preferred embodiment of the invention. Various changes and modifications may be made without departing from the spirit and scope of the invention. Thus, by way of example and not of limitation, other conductive or glass pastes may be employed in the formation of the capacitor and the electrical interconnections for the circuit, as well as for the overlying insulating coating. In addition, other mechanical mounting arrangements for the ceramic chip may be employed, and the sensing capacitor and the signal processing circuitry may be formed on separate substrates. Accordingly, the present invention is not limited to a construction precisely as described hereinabove and as shown in the drawings.

What is claimed is:

1. A cost-effective, sensitive liquid dielectric constant sensor assembly comprising:
   a housing;
   a securing mechanism for holding the housing onto a container for liquid;
   a flat circuit board having a printed capacitor thereon, the capacitor being in the form of a pair of sets of closely spaced conductive lines or passageways printed on the circuit board, said lines being less than 0.050 inch apart;
   said circuit board being mounted within said housing to extend outwardly from the securing mechanism with said conductive lines being exposed to the liquid when the housing is mounted on the container;

said flat circuit board having two ends, with a signal processing circuit including printed circuitry directly mounted onto said flat printed circuit board, mounted on one end thereof, said printed capacitor being formed on the other end thereof and wherein the printed circuitry for said signal processing circuitry is substantially coplanar with said printed capacitor;

seal arrangements extending around said circuit board between said printed capacitor and said signal processing circuit, and between said circuit board and said housing, to block liquid from said signal processing circuit; and at least one opening in said housing to permit fluid flow to said printed capacitor.

2. An assembly as defined in claim 1 wherein said capacitor is formed of two interfitting sets of conductive lines, with the conductive lines of one set of said pair of lines interfitting with the other set corresponding to the interfitting of the teeth of two combs facing one another.

3. An assembly as defined in claim 1 wherein said conductive lines have a thin overlying layer of insulating material.

4. An assembly as defined in claim 3 wherein said insulating material is glass.

5. An assembly as defined in claim 1 wherein said circuit board is formed of alumina, or aluminum oxide.

6. An assembly as defined in claim 1 wherein said circuit board has first and second sides, and wherein said capacitor is on the first side thereof and a metallic ground plane is formed on the second side thereof.

7. An assembly as defined in claim 6 wherein one of said sets of conductive lines is electrically connected to said ground plane.

8. An assembly as defined in claim 1 wherein said capacitor is formed of an alloy of silver and palladium.

9. An assembly as defined in claim 1 wherein said printed circuitry for said signal processing circuitry is formed of the same material as said printed capacitor, and forms an integral connection between said signal processing circuitry and printed capacitor.

10. A cost-effective, sensitive liquid dielectric constant sensor assembly comprising:

a housing;

a securing mechanism for holding the housing onto a container for liquid;

a circuit board having a printed capacitor thereon, the capacitor being in the form of a pair of sets of closely spaced conductive lines or passageways printed on the circuit board, said lines being less than 0.050 inch apart;

said circuit board being mounted within said housing to extend outwardly from the securing mechanism with said conductive lines being exposed to the liquid when the housing is mounted on the container;

said circuit board having two ends, with a signal processing circuit including printed circuitry directly mounted onto said printed circuit board mounted on one end thereof, said printed capacitor being formed on the other end thereof, and wherein the printed circuitry for said signal processing circuitry is substantially coplanar with said printed capacitor;

said printed circuitry for said signal processing circuit and for said printer capacitor being found of the same material;

a seal extending around said circuit board between said printed capacitor and said signal processing circuit and between said circuit board and said housing, to block liquid from said signal processing circuit; and at least one opening in said housing to permit fluid flow to said printed capacitor.

* * * * *